(12) United States Patent
Miyai

(10) Patent No.: US 6,245,664 B1
(45) Date of Patent: Jun. 12, 2001

(54) METHOD AND SYSTEM OF INTERCONNECTING CONDUCTIVE ELEMENTS IN AN INTEGRATED CIRCUIT

(75) Inventor: Yoichi Miyai, Toride (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/218,829

(22) Filed: Dec. 22, 1998

Related U.S. Application Data

(60) Provisional application No. 60/070,436, filed on Jan. 5, 1998.

(51) Int. Cl.[7] ................................................. H01L 21/4763
(52) U.S. Cl. .......................... 438/622; 438/629; 438/637; 438/672
(58) Field of Search ................................... 438/618, 622, 438/629, 631, 637, 638, 672

(56) References Cited

U.S. PATENT DOCUMENTS

| | | | | |
|---|---|---|---|---|
| 5,726,098 | * | 3/1998 | Tsuboi .................................. | 438/622 |
| 5,759,914 | * | 6/1998 | Park ...................................... | 438/624 |
| 5,824,579 | * | 10/1998 | Subramanian et al. ............... | 438/238 |
| 5,859,264 | * | 4/1999 | Teo ....................................... | 438/632 |
| 5,972,788 | * | 10/1999 | Ryan et al. ........................... | 438/634 |
| 6,022,804 | * | 2/2000 | Yano et al. ........................... | 438/675 |
| 6,180,514 | * | 1/2001 | Yeh et al. .............................. | 438/633 |

FOREIGN PATENT DOCUMENTS 4-355951 * 12/1992 (JP) ..................................... 438/622

* cited by examiner

*Primary Examiner*—T. N. Quach
(74) *Attorney, Agent, or Firm*—Wade James Brady, III; Frederick J. Telecky, Jr.

(57) ABSTRACT

Method and system of interconnecting conductive elements includes forming a lower conductive element (14) having a lower contact section (22) with a width (24) not more than substantially that of an adjacent section (26) of the lower conductive element (14). A first insulation layer (18) may be formed outwardly of the lower conductive element (14). An upper conductive element (16) may be formed outwardly of the first insulation layer (18). The upper conductive element (16) may have a upper contact section (28) with a width (30) not more than substantially that of an adjacent section (32) of the upper conductive element (16). A second insulation layer (20) may be formed outwardly of the first insulation layer (18) and the upper conductive element (16). A contact hold (40) may be formed in the first and second insulation layers (18, 20) exposing a lower contact area (42) of the lower contact section (22) and an upper contact area (44) of the upper contact section (28). An interconnect (54) may be formed in the contact hole (40) connecting the contact areas (42, 44) of the lower and upper conductive elements (14, 16). The interconnect (54) may have a substantially uniform width (56) between the lower and upper conductive elements (14, 16).

16 Claims, 3 Drawing Sheets

METHOD AND SYSTEM OF INTERCONNECTING CONDUCTIVE ELEMENTS IN AN INTEGRATED CIRCUIT

This application claims priority under 35 U.S.C. § 119 (e)(1) of provisional application No. 60/070,436 filed Jan. 5, 1998.

RELATED APPLICATIONS

This application is related to U.S. patent application Ser. No. 09/209,374, entitled "SYSTEM OF INTERCONNECTING CONDUCTIVE ELEMENTS OF AN INTEGRATED CIRCUIT AND METHOD" (TI-26869), filed Dec. 10, 1998, abandoned.

TECHNICAL FIELD OF THE INVENTION

This invention relates generally to the field of semiconductor devices, and more particularly to a method and system of interconnecting conductive elements in an integrated circuit.

BACKGROUND OF THE INVENTION

Modern electronic equipment such as televisions, telephones, radios and computers are often constructed of solid state components. Solid state components have no moving parts, but operate based on the movement of charged carriers. As a result, solid state components are extremely reliable, very small and relatively inexpensive.

Solid state components may be transistors, capacitors, resistors and the like based on or utilizing semiconductor materials. Such components are typically formed on a wafer of substrate material as part of an integrated circuit. In the integrated circuit, the solid state components are suitably laid out, isolated and interconnected to form memory arrays and other types of useful circuits. The components are conventionally isolated by insulation layers formed between active areas, leads and other conductive regions and interconnected by conductors passed through the insulation layers to connect the active areas, leads and other conductive regions at specified locations.

To allow vertical interconnection of components in an integrated circuit, an active area, lead or conductive region is typically enlarged at a contact point to horizontally overlap a contact point of the connecting active area, lead or conductive region. This enlargement of contact points, however, increases the size of the integrated circuit and causes difficulty in laying out the integrated circuit. The enlargement is especially problematic for DRAM cells and other types of circuits that have an array of repeatedly duplicated components and wiring. In addition, the enlarged contact points increases parasitic capacitance of active areas, leads and conductive regions, which reduces the speed of the integrated circuit.

Alternatively, an intermediate wiring layer, or pad, has been used to interconnect active areas, leads or conductive regions of an integrated circuit. In this arrangement, the intermediate pad is typically disposed between and horizontally overlaps the contact points of active areas, leads or conductive regions to be interconnected. A first vertical conductor connects a first active area, lead or conductive region to a first side of the intermediate pad and a second vertical conductor connects a second active area, lead or conductive region to a second side of the intermediate pad. The intermediate pad, however, requires additional material and process steps to fabricate, including relatively expensive photo lithography masking steps.

SUMMARY OF THE INVENTION

Accordingly, a need has arisen in the art for an improved interconnect between active areas, leads or conductive regions of an integrated circuit. The present invention provides a method and system of interconnecting conductive elements in an integrated circuit that substantially eliminate or reduce problems associated with previous systems and methods.

In accordance with the present invention, conductive elements of an integrated circuit may be interconnected by forming a lower conductive element having a lower contact section with a width not more than substantially that of an adjacent section of the lower conductive element. A first insulation layer may be formed outwardly of the lower conductive element. An upper conductive element may be formed outwardly of the insulation layer. The upper conductive element may have a upper contact section with a width not more than substantially that of an adjacent section of the upper conductive element. A second insulation layer may be formed outwardly of the first insulation layer and the upper conductive element. A contact hole may be formed in the first and second insulation layers exposing a lower contact area of the lower contact section and an upper contact area of the upper contact section. An interconnect may be formed in the contact hole connecting the contact areas of the lower and upper conductive elements. The interconnect may have a substantially uniform width between the lower and upper conductive elements.

More specifically, in accordance with one embodiment of the present invention, the lower contact section may be substantially uniform in width to the adjacent section of the lower conductive element. The upper contact section may be substantially uniform in width to the adjacent section of the upper conductive element. In this and other embodiments, the contact sections may be non overlapping. The lower contact area may substantially comprise a top of the lower conductive element and the upper contact area may substantially comprise a sidewall of the upper conductive element.

In accordance with the one aspect of the present invention, three or more conductive elements may be connected by the interconnect. Each of the conductive elements may have a contact section with a width not more than substantially that of an adjacent section of the conductive element. The interconnect may have a substantially uniform width between each set of conductive elements.

Important technical advantages of the present invention include providing an improved integrated circuit. In particular, the integrated circuit may comprise conductive elements having contact sections with a width not more than substantially that of an adjacent section of the conductive elements. Thus, the conductive elements may be interconnected without enlarged contact sections that increase size and reduce performance of the integrated circuit. In addition, the integrated circuit may be more easily laid out.

Another technical advantage of the present invention includes providing an improved method and system of interconnecting conductive elements in an integrated circuit. In particular, an interconnect may overlap a first conductive element and abut a second conductive element. Thus, the conductive elements need not overlap or be connected by an intermediate wiring layer. Accordingly, manufacturing costs of the integrated circuit is reduced.

Other technical advantages will be readily apparent to one skilled in the art from the following figures, descriptions, and claims.

BRIEF DESCRIPTION OF THE DRAWINGS

For a more complete understanding of the present invention and its advantages thereof, reference is now made to the following description taken in conjunction with the accompanied drawings, wherein like reference numerals represent like parts, in which.

DETAILED DESCRIPTION OF THE INVENTION

Figure 1A:
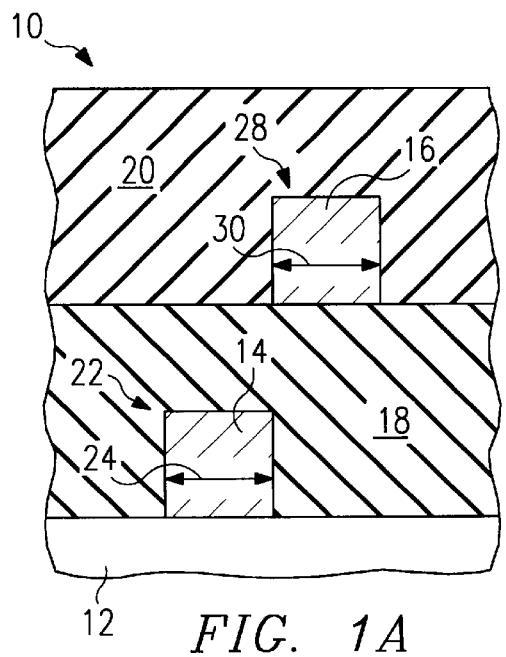
FIGS. 1A–1E are a series of schematic cross-sectional diagrams illustrating a method and system of interconnecting conductive elements in an integrated circuit in accordance with the one embodiment of the present invention.
Figure 1B:
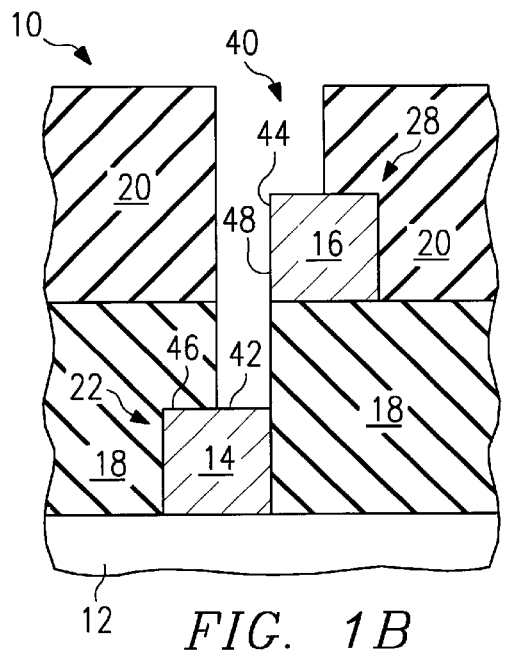
Figure 1C:
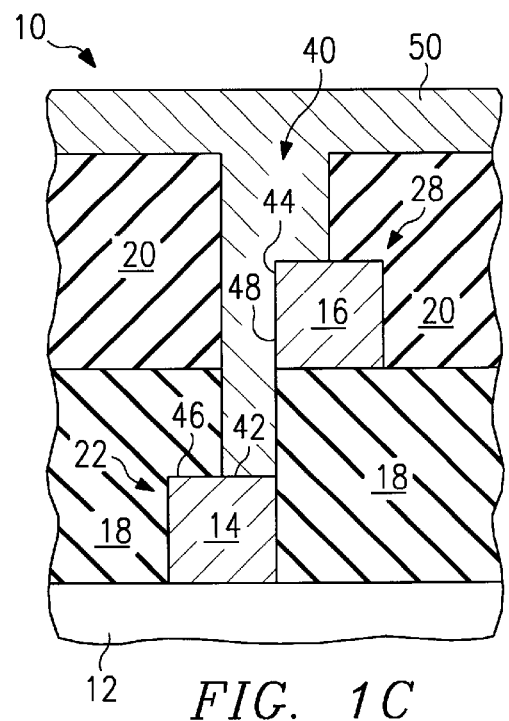
Figure 1D:
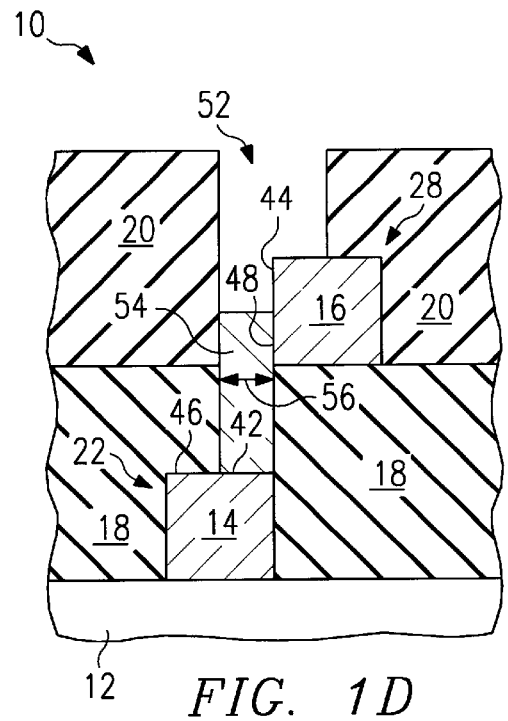
Figure 1E:
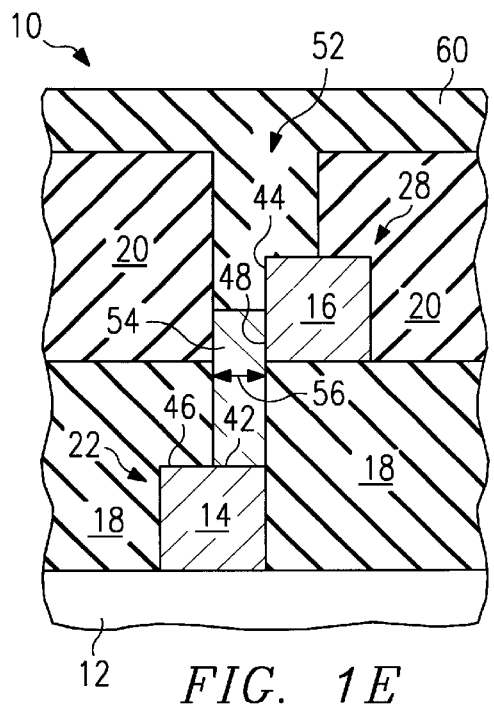
Figure 2:
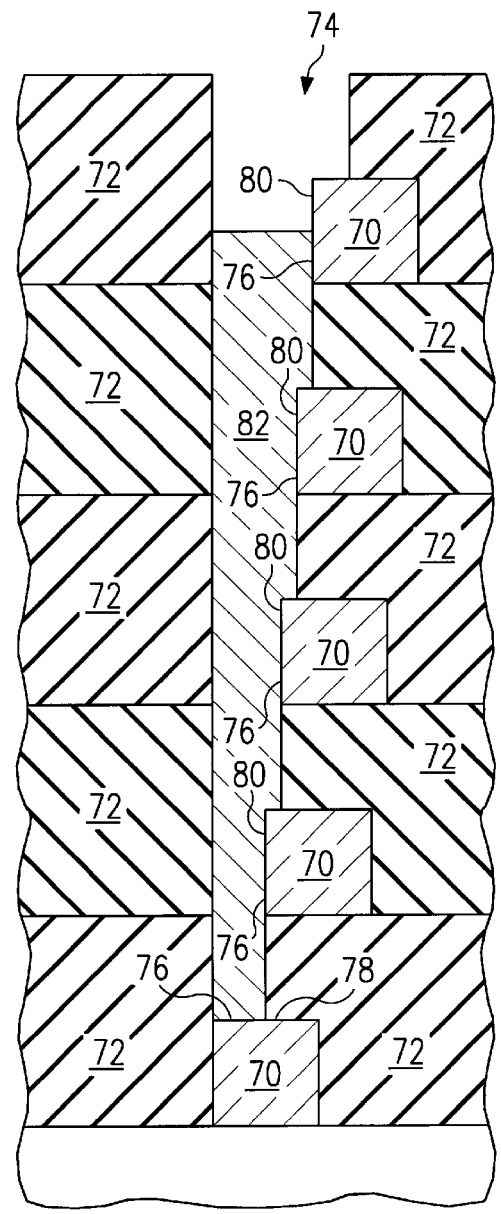
FIG. 2 is a cross-sectional diagram illustrating interconnection of a number of conductive elements in an integrated circuit in accordance with one embodiment of the present invention.

The preferred embodiments of the present invention and its advantages are best understood by referring now in more detail to FIGS. 1–3 of the drawings, in which like numerals refer to like parts throughout the several views. FIGS. 1–3 illustrate a method and system of interconnecting conductive elements in an integrated circuit. As described in more detail below, the integrated circuit may comprise conductive elements having contact sections with a width not more than substantially that of adjacent sections of the conductive elements. An interconnect may overlap a first conductive element and abut a second conductive element. Thus, the conductive elements may be interconnected without enlarged contact sections that increase size and reduce performance of the integrated circuit. In addition, the conductive elements need not overlap or be connected by an intermediate wiring layer. Accordingly, the integrated circuit may be more easily laid out and manufacturing costs reduced.

FIG. 1A illustrates an initial semiconductor structure 10 of an integrated circuit in accordance with one embodiment of the present invention. In this embodiment, the initial semiconductor structure 10 comprises a substrate 12 and a lower conductive element 14 suitably insulated from an upper conductive element 16. The substrate 12 may comprise an insulative material such as oxide. It will be understood that the substrate 12 may comprise other suitable materials or structures without departing from the scope of the present invention. For example, the substrate 12 may comprise active devices such as transistors, capacitors, resistors and the like. Accordingly, the lower and upper conductive elements 14 and 16 may be constructed in the midst of active devices as long as the conductive elements 14 and 16 are suitably insulated from the other devices.

Referring to FIG. 1A, the lower conductive element 14 is formed outwardly of the substrate 12. The lower conductive element 14 may comprise a lead or active area of the integrated circuit capable of storing, conveying or otherwise responding to a digital, analog or other electrical signal or pulse. It should be understood that while the lower conductive element 14 is illustrated as having a substantially square cross section, the lower conductive element 14 may be otherwise configured without departing from the scope of the present invention. Thus, for example, the lower conductive element 14 may comprise a thin film, layer or well and may have rounded edges or ends.

In the lead embodiment of the lower conductive element 14, the lower conductive element 14 may comprise a metal strip, trace or other electrical connector. The metal lead may be formed using conventional integrated circuit fabrication techniques such as, for example, sputtering or evaporating the metal onto an underlying layer and patterning and etching the metal to define the lead. The metal may comprise aluminum, aluminum-copper, a metal alloy or other suitable metallic conductor.

In the active area embodiment of the lower conductive element 14, the lower conductive element 14 may comprise a source, drain, gate, electrode, word line, bit line or other suitable region or structure of an active device. The active area may be formed in accordance with conventional integrated circuit fabrication techniques such as, for example, doping poly crystalline, amorphous, partially recrystallized, or wholly recrystallized silicon so as to be rendered conductive. Dopants may comprise p-type dopants such as boron, n-type dopants such as arsenic or antimony and the like. It will be understood that the lower conductive element 14 may be otherwise constructed by suitable integrated circuit fabrication techniques without departing from the scope of the present invention.

A first insulation layer 18 is formed outwardly of the lower conductive element 14 and the substrate 12. In one embodiment, the first insulation layer 18 may comprise oxide conventionally deposited onto the lower connective element 14 and the substrate 12. It will be understood that the first insulation layer 18 may comprise other dielectric materials capable of electrically insulating the lower conductive element 14. It will be further understood that the first insulation layer 18 may be otherwise formed by suitable integrated circuit techniques without departing from the scope of the present invention.

The upper conductive element 16 is formed outwardly of the first insulation layer 18. As previously described in connection with the lower conductive element 14, the upper conductive element 16 may comprise a lead or active area of the integrated circuit capable of storing, conveying or otherwise responding to a digital, analog or other electrical signal or pulse. It should be understood that while the upper conductive element 16 is illustrated as having a substantially square cross section, the upper conductive element 16 may be otherwise configured without departing from the scope of the present invention. Thus, for example, the upper conductive element 16 may comprise a thin film, layer or well and may have rounded edges or ends.

In the lead embodiment of the upper conductive element 16, the upper conductive element 16 may comprise a metal strip, trace or other electrical connector. The metal lead may be formed using conventional integrated circuit fabrication techniques such as, for example, sputtering or evaporating the metal onto an underlying layer and patterning and etching the metal to define the lead. The metal may comprise aluminum, aluminum-copper, a metal alloy or other suitable metallic conductor.

In the active area embodiment of the upper conductive element 16, the upper conductive element 16 may comprise a source, drain, gate, electrode, word line, bit line or other suitable region or structure of an active device. The active area may be formed in accordance with conventional integrated circuit fabrication techniques such as, for example, doping poly crystalline, amorphous, partially recrystallized, or wholly recrystallized silicon so as to be rendered conductive. Dopants may comprise p-type dopants such as boron, n-type dopants such as arsenic or antimony and the like. It will be understood that the upper conductive element 16 may be otherwise constructed by suitable integrated circuit fabrication techniques without departing from the scope of the present invention.

A second insulation layer 20 may be formed outwardly of the upper conductive element 16 and the first insulation layer 18. In one embodiment, the second insulation layer 20 may comprise oxide conventionally deposited onto the upper conductive element 16 and the first insulation layer 18. It will be understood that the second insulation layer 20 may comprise other dielectric materials capable of electrically insulating the upper conductive element 16. It will be further understood that the second insulation layer 20 may be otherwise formed by suitable integrated circuit techniques without departing from the scope of the present invention.

Figure 3A:
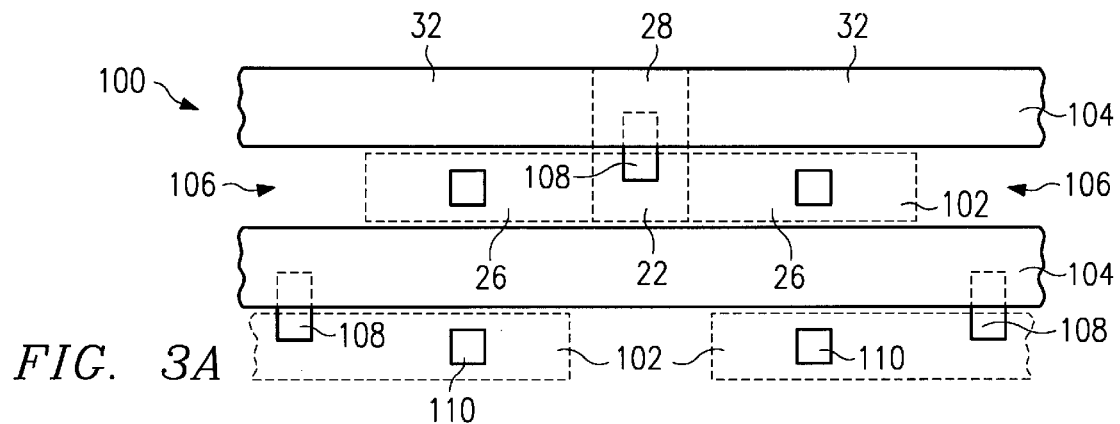
FIGS. 3A–3D are a series of plane views illustrating several arrays of conductive elements for a DRAM cell embodiment of the present invention.

As shown by FIGS. 1A and 3A, the lower conductive element 14 comprises a lower contact section 22 with a width 24 not more than substantially that of an adjacent section 26 of the lower conductive element 14. The upper conductive element 16 comprises an upper contact section 28 with a width 30 not more than substantially that of an adjacent section 32 of the upper conductive element 16. The contact sections 22 and 28 are the sections of the conductive elements 14 and 16 that will contact an interconnect. Thus, the lower and upper conductive elements 14 and 16 are free of enlarged contact sections that create parasitic capacitance and reduce performance of the integrated circuit. In addition, the integrated circuit may be more easily laid out and of a smaller size due to the absence of the enlarged contact sections.

Figure 3B:
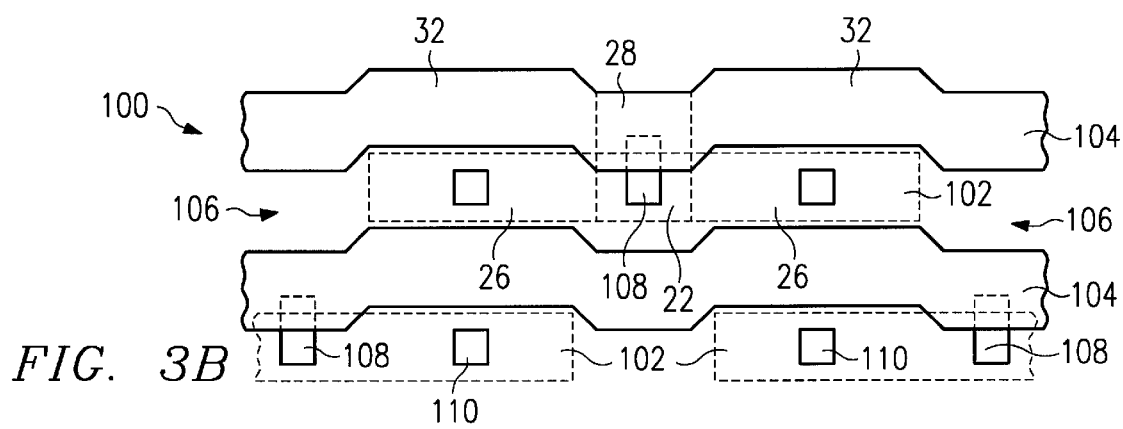
Figure 3C:
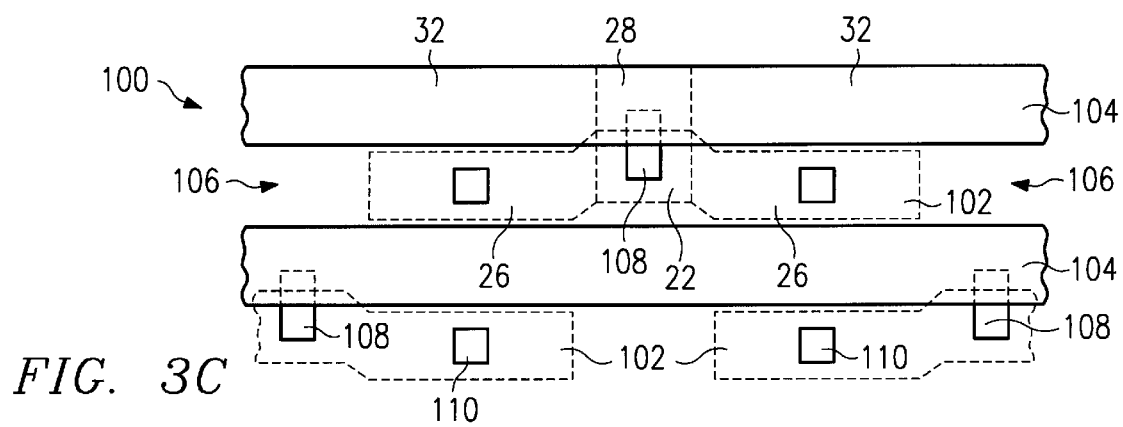
Figure 3D:
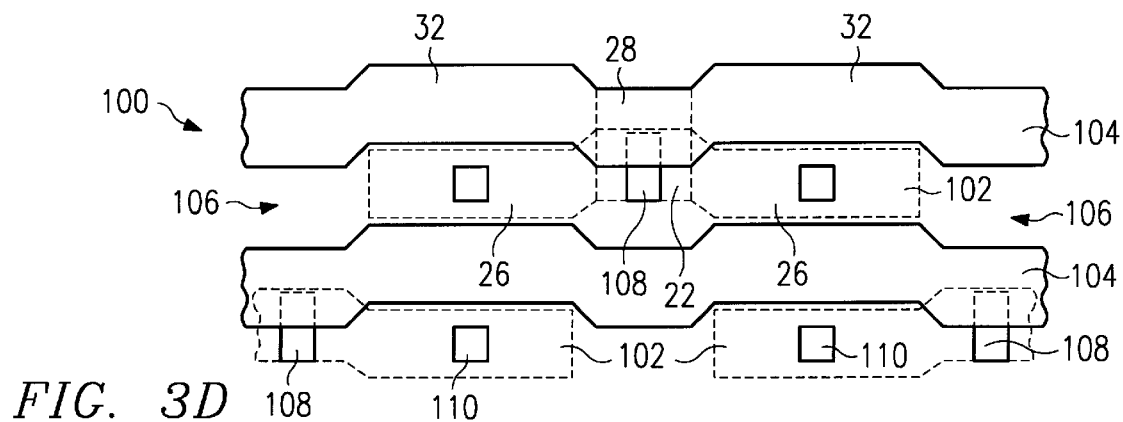

In one embodiment, the lower contact section 22 may be uniform or substantially uniform in width 24 to the adjacent section 26 of the lower conductive element 14. Similarly, the upper contact section 28 may be uniform or substantially uniform in width 30 to the adjacent section 32 of the upper conductive element 16. In this and other embodiments, the lower and upper contact sections 22 and 28 of the conductive elements 14 and 16 may be non overlapping. The adjacent sections 26 and 32 and other parts of the conductive elements 14 and 16 may also be non overlapping. It will be understood that the lower and upper contact sections 22 and 28, adjacent sections 26 and 32 and other parts of the conductive elements 14 and 16 may be otherwise suitably disposed relative to each other. For example, as illustrated by FIGS. 3B–D and discussed in more detail below, the lower and/or upper contact sections may be horizontally displaced from the adjacent sections of the conductive elements to partially overlap the one another. It will be further understood that the contact sections 22 and 28 may otherwise have a width not more than substantially that of the adjacent sections of the conductive elements without departing from the scope of the present invention. For example, one or both of the contact sections may have a width narrower than that of the adjacent sections of the conductive elements.

Referring to FIG. 1B, a contact hole 40 is formed in the first and second insulation layers 18 and 20 exposing a lower contact area 42 of the lower contact section 22 and an upper contact area 44 of the upper contact section 28. The contact areas 42 and 44 are the areas of the contact section 22 and 28 contacted by the interconnect. In one embodiment, the lower contact area 42 may substantially comprise a top 46 of the lower conductive element 14 and the upper contact area 44 may substantially comprise a sidewall 48 of the upper conductive element 16. Thus, as described in more detail below, an interconnect may overlap the top 46 of the lower conductive element 14 and abut the sidewall 48 of the upper conductive element 16. It will be understood that the contact areas 42 and 44 may comprise other suitable parts of the lower and upper conductive elements 14 and 16 without departing from the scope of the present invention. For example, the lower contact area 42 may include a sidewall of the lower conductive element 14, the upper contact area 44 may include a top or bottom of the upper conductive element 16 and the like.

The contact hole 40 may be formed by conventional masking and etching processes. In one embodiment, a mask may be patterned over the second insulation layer 20 and the contact hole 40 vertically etched in the first and second insulation layers 18 and 20 down to the lower and upper conductive elements 14 and 16. The lower and upper conductive elements 14 and 16 may act as a etch stop to protect the substrate 12. In this embodiment, the etch may be a anisotropic etch such as a conventional reactive ion etch (RIE) using carbon fluorene-based gases such as $CF_4$ or $CHF_3$. Because the etch is anisotropic, it will vertically etch the contact hole 40 in the insulation layers 18 and 20 without laterally attacking the insulation layers 18 and 20. Thus, as described in more detail below, the contact hole 40 forms a substantially vertical mold for interconnect fabrication.

The size of the contact hole 40 and the areas of the conductive elements 14 and 16 exposed by the contact hole 40 may be controlled by suitably patterning the mask. In one embodiment, the contact hole 40 may be sized and positioned to substantially overlap the lower and upper conductive elements 14 and 16 to compensate for misalignment errors. This ensures that the contact hole 40 will suitably expose the contact areas 42 and 44 of the lower and upper contact sections 22 and 28. It will be understood that the contact hole 40 may be otherwise formed by suitable integrated circuit fabrication techniques without departing from the scope of the present invention.

Referring to FIG. 1C, a layer of electrically conductive material 50 is formed outwardly of the second insulation layer 20 and in the contact hole 40. The layer of electrically conductive material 50 may be formed by any suitable process such as, for example, sputtering or evaporating the metal onto the second insulation layer 20 and into the contact hole 40. The metal may comprise aluminum, aluminum-copper, a metal alloy or the like. It will be understood that the layer of conductive material 50 may comprise other suitable materials or be otherwise formed without departing from the scope of the present invention.

Referring to FIG. 1D, an excess portion of the conductive material 50 is removed from the second insulation layer 20 and an upper portion 52 of the contact hole 40 to leave an interconnect 54 extending between and connecting the contact areas 42 and 44 of the lower and upper conductive elements 14 and 16. As previously described, the lower contact area 42 may substantially comprise a top 46 of the lower conductive element 14 and the upper contact area 44 may substantially comprise a sidewall 48 of the upper conductive element 16. Thus, the interconnect 54 may overlap the lower conductive element 14 and abut the upper conductive element 16. In addition, the interconnect 54 may have a substantially uniform width between the lower and upper conductive elements 14 and 18. Accordingly, the contact sections 22 and 28 of the conductive elements 14 and 16 are interconnected without enlargement, overlap or an intermediate wiring layer. As a result, the integrated circuit has a reduced size and an increased performance. In addition, the integrated circuit may be more easily laid out and the manufacturing costs reduced.

The excess portion of the conductive material 50 may be removed from the upper portion 52 of the contact hole 40 by a suitable etching process. The etchant should selectively etch the conductive material 50 relative to the material of the second insulation layer 20 and the upper conductive element 16. In one embodiment, the upper portion 52 of the contact hole 40 from which the excess conductive material 50 is removed may comprise that portion of the contact hole 40 above the upper conductive element 16. It will be understood that the upper portion 52 of the contact hole 40 from which the excess conductive material 50 is removed may comprise other portions of the contact hole 40 so long as the remaining conductive material 50 that forms the interconnect 54 extends between and connects the contact areas 42 and 44 of the lower and upper conductive elements 14 and 16. Thus, the interconnect 54 may abut only part of the sidewall 48 of the upper conductive element 16. It will be further understood that the excess portion of the conductive material 50 may be otherwise removed from the upper portion 52 of the contact hole 40 by suitable integrated circuit processing techniques without departing from the scope of the present invention.

Referring to FIG. 1E, an interconnect insulation layer 60 is formed outwardly of the second insulation layer 20 and in the upper portion 52 of the contact hole 40. In one embodiment, the interconnect insulation layer 60 may comprise oxide conventionally deposited on the second insulation layer 20 and in the upper portion of the contact hole 52. It will be understood that the interconnect insulation layer 60 may comprise other dielectric materials capable of electrically insulating the interconnect 54. It will be further understood that the interconnect insulation layer 60 may otherwise formed by suitable integrated circuit processing techniques without departing from the scope of the present invention.

FIG. 2 illustrates interconnection of a number of conductive elements 70 in accordance with the method and system of the present invention. In this embodiment, the conductive elements 70 may be constructed as previously described in connection with the conductive elements 14 and 16. The conductive elements 70 may be generally isolated by insulation layers 72 constructed as previously described in connection with the insulation layers 18 and 20.

After construction of the conductive elements 70 and insulation layers 72, a contact hole 74 may be formed through the insulation layers 72 exposing contact areas 76 of each conductive element 70. The contact hole 74 may be formed by an anisotropic etch as previously described in connection with the contact hole 40. In one embodiment, the contact area 76 of the lowermost conductive element 70 may comprise a top 78 of that conductive element 70 and the contact areas 76 of subsequent conductive elements 70 may comprise a sidewall 80 of those conductive elements 70. An interconnect 82 may be formed in the contact hole 74 and insulated as previously described in connection with the interconnect 54. The interconnect 74 may have a substantially uniform width between each set of conductive elements 70. Thus, a plurality of conductive elements 70 may be interconnected without enlarged contact sections, overlap or intermediate wiring layers.

FIGS. 3A–D illustrates a DRAM cell 100 interconnected in accordance with the method and system of the present invention. The DRAM cell 100 comprises a Cell Over Bit line (COB) structure. The DRAM cell has strict layout restrictions regarding the bit line contact and the storage node contact where the bit line contact must be connected to the bit line but the storage node contact must not touch the bit line. Due to this restriction, the present invention is especially advantageous for DRAM cells in that the active regions and bit lines are constructed substantially uniform in width and interconnected without an intermediate layer. Accordingly, problems of small isolation regions caused by enlargement of the active areas and high capacitance and resistance caused by enlargement of the bit lines are substantially reduced or eliminated. In addition, manufacturing cost are reduced. It will be understood that other types of suitable electronic devices or circuits may be interconnected or formed by interconnecting other electronic devices and components in accordance with the method and system of the present invention.

Referring to FIGS. 3A–D, the DRAM cell 100 may comprise a plurality of active areas 102 and bit lines 104. The active areas 102 may comprise doped silicon as previously described in connection with the lower conductive element 14. As also described in connection with the lower conductive element 14, the active areas 102 may have contact sections 22 substantially uniform in width to the adjacent section 26 of the active areas 102. The bit lines 104 may comprise leads as previously described in connection with the upper conductive element 16. The bit lines 104 may have contact sections 28 substantially uniform in width to the adjacent section 32 of the bit lines 104.

The active areas 102 and bit lines 104 may be generally isolated from each other by an insulator under bit line 106 as previously described in connection with the insulation layers 18 and 20. The active areas 102 and bit lines 104 may be interconnected by bit line contacts 108 as previously described in connection with the interconnect 54. Thus, the bit line contacts 108 may overlap part of the active areas 102 and abut part of the bit lines 104. In addition, the bit line contacts 108 may have a substantially uniform width between the active areas 102 and bit lines 104. Accordingly, the active areas 102 and bit lines 104 are interconnected without enlargement, overlap or an intermediate wiring layer. As a result, the DRAM cell 100 has a reduced size and an increased performance. In addition, the DRAM cell 100 may be more easily laid out with the bit line contacts 108 connected to the bit line 104 and the storage node contacts 110 suitably spaced apart from the bit lines 104. Manufacturing costs are also reduced.

For the DRAM cell embodiment of FIG. 3A, the active areas 102 and bit lines 104 are substantially straight and parallel to each other. The active areas 102 and bit lines 104 are uniform in width and do not overlap each other. Thus, the DRAM cell may be very easily laid out and constructed in this embodiment.

For the DRAM cell embodiment of FIG. 3B, the active areas 102 are substantially straight. The bit lines 104 comprise contact sections 28 that are horizontally displaced from the adjacent sections 32 of the bit lines 104 to at least partially overlap the contact sections 22 of the active areas 102. The overlap of the contact sections may compensate for alignment errors during fabrication of the DRAM cell. Although the contact sections overlap each other in this embodiment, the bit line contact 108 remains aligned over the top of the active area 102 and abuting the sidewall of the bit line 104. In addition, as shown in FIG. 3B, the width of the bit lines 104 remains uniform.

For the DRAM cell embodiment of FIG. 3C, the active areas 102 comprise contact sections 22 that are horizontally displaced from the adjacent sections 26 of the active areas 102 to at least partially overlap the contact sections 28 of the bit lines 104. The bit lines 104 are substantially straight. As previously described, the overlap of the contact sections may compensate for alignment errors during fabrication of the DRAM cell. Although the contact sections overlap each other in this embodiment, the bit line contact 108 remains aligned over the top of the active area 102 and abutting the sidewall of the bit line 104. In addition, as shown in FIG. 3C, the width of the active areas 102 remains uniform.

For the DRAM cell embodiment of FIG. 3D, the active areas 102 comprise contact sections 22 that are horizontally displaced from the adjacent sections 26 of the active areas 102 to at least partially overlap the contact sections 28 of the bit lines 104. The bit lines 104 comprise contact sections 28 that are horizontally displaced from the adjacent sections 32 of the bit lines 104 to at least partially overlap the contact sections 22 of the active areas 102. As previously described, the overlap of the contact sections may compensate for alignment errors during fabrication of the DRAM cell. Although the contact sections overlap each other in this embodiment, the bit line contact 108 remains aligned over the top of the active area 102 and abutting the sidewall of the bit line 104. In addition, as shown in FIG. 3D, the width of the active areas 102 and bit lines 104 remain uniform.

Although the present invention has been described with several embodiments, various changes and modifications may be suggested to one skilled in the art. It is intended that the present invention encompass such changes and modifications as fall within the scope of the appended claims.

What is claimed is:

1. A method of interconnecting conductive elements of an integrated circuit, comprising the steps of:
   forming a lower conductive element having a lower contact section with a width not more than substantially that of an adjacent section of the lower conductive element;
   forming a first insulation layer outwardly of the lower conductive element;
   forming an upper conductive element outwardly of the first insulation layer, the upper conductive element having an upper contact section with a width not more than substantially that of an adjacent section of the upper conductive element;
   forming a second insulation layer outwardly of the first insulation layer and the upper conductive element;
   forming a contact hole in the first and second insulation layers exposing a lower contact area of the lower contact section and an upper contact area of the upper contact section; and
   forming an interconnect in the contact hole connecting the contact areas of the lower and upper conductive elements, the interconnect having a substantially uniform width between the lower and upper conductive elements.

2. The method of claim 1, wherein the lower contact section is substantially uniform in width to the adjacent section of the lower conductive element and the upper contact section is substantially uniform in width to the adjacent section of the upper conductive element.

3. The method of claim 1, wherein the contact area of at least one of the conductive elements substantially comprises a sidewall of the conductive element.

4. The method of claim 1, wherein the lower contact area substantially comprises a top of the lower conductive element and the upper contact area substantially comprises a sidewall of the upper conductive element.

5. The method of claim 1, wherein the lower contact section is uniform in width to the adjacent section of the lower conductive element and the upper contact section is uniform in width to the adjacent section of the upper conductive element.

6. The method of claim 1, wherein the contact hole exposes a top of the lower conductive element and a sidewall of the upper conductive element.

7. The method of claim 1, wherein the contact hole exposes a top of the lower conductive element and a sidewall of the upper conductive element, the step of forming the interconnect further comprising the steps of;
   depositing a conductive material in the contact hole;
   etching away an excess portion of the conductive material deposited in an upper portion of the contact hole; and
   forming an interconnect insulator in the upper portion of the contact hole.

8. The method of claim 1, wherein the contact sections of the lower and upper conductive elements are non overlapping.

9. The method of claim 1, wherein at least one of the contact sections at least partially overlaps the other contact section.

10. The method of claim 1, wherein the contact section of at least one of the conductive elements is horizontally displaced from the adjacent section of the conductive element to at least partially overlap the contact section of the other conductive element.

11. The method of claim 1, further comprising the steps of;
   prior to forming a contact hole, forming an over upper conductive element outwardly of the second insulation layer, the over upper conductive element having an over upper contact section with a width not more than substantially that of an adjacent section of the over upper conductive element;
   forming a third insulation layer outwardly of the second insulation layer and the over upper conductive element;
   the step of forming the contact hole comprising forming the contact hole in the first, second and third insulation layers exposing a lower contact area of the lower contact section, an upper contact area of the upper contact section and an over upper contact area of the over upper contact section; and
   the step of forming the interconnect comprising forming an interconnect in the contact hole connecting the contact areas of the lower, upper and over upper conductive elements, the interconnect having a substantially uniform width between the lower and upper conductive elements and between the upper and over upper conductive elements.

12. A method of fabricating a memory device, comprising the steps of:
   forming a first active region on a substrate, the first active region having a first contact section with a width not more than substantially that of an adjacent section of the first active region;
   forming a second active region on the substrate, the second active region having a second contact section with a width not more than substantially that of an adjacent section of the second active region;
   forming a first insulation layer outwardly of the first and second active regions and the substrate;
   forming an upper conductive element outwardly of the first insulation layer, the upper conductive element having an upper contact section with a width not more than substantially that of an adjacent section of the upper conductive element;
   forming a second insulation layer outwardly of the first insulation layer and the upper conductive element;
   forming a first contact hole in the first and second insulation layers exposing a first contact area of the first contact section and a first upper contact area of the upper contact section;

forming a second contact hole in the first and second insulation layers exposing a second contact area of the second contact section and a second upper contact area of the upper contact section;

forming a first interconnect in the first contact hole connecting the first contact area of the first active region and the first upper contact area of the upper conductive element, the first interconnect having a substantially uniform width between the first active region and the upper conductive element; and forming a second interconnect in the second contact hole connecting the second contact area of the second active region and the second upper contact area of the upper conductive element, the second interconnect having a substantially uniform width between the second active region and the upper conductive element.

13. The method of claim 12, wherein the first contact area substantially comprises a top of the first active region, the second contact area substantially comprises a top of the second active region and the upper contact areas each substantially comprise a sidewall of the upper conductive element.

14. The method of claim 12, wherein the first contact section is uniform in width to the adjacent section of the first active region, the second contact section is uniform in width to the adjacent section of the second active region and the upper contact section is uniform in width to the adjacent section of the upper conductive element.

15. The method of claim 12, wherein the contact sections of the active regions and the conductive element are non overlapping.

16. The method of claim 12, wherein the active regions comprise storage nodes of a DRAM cell array and the conductive element comprises a bit line of the DRAM cell.

* * * * *